(12) United States Patent
Yamane

(10) Patent No.: US 8,421,558 B2
(45) Date of Patent: Apr. 16, 2013

(54) BOUNDARY ACOUSTIC WAVE DEVICE HAVING AN INTERDIGITAL TRANSDUCER ELECTRODE IN A GROOVE

(75) Inventor: Takashi Yamane, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 364 days.

(21) Appl. No.: 12/752,167

(22) Filed: Apr. 1, 2010

(65) Prior Publication Data
US 2010/0259342 A1 Oct. 14, 2010

(30) Foreign Application Priority Data

Apr. 14, 2009 (JP) ................................. 2009-097932
Mar. 4, 2010 (JP) ................................. 2010-048082

(51) Int. Cl.
*H03H 9/13* (2006.01)
*H03H 9/145* (2006.01)
*H03H 9/15* (2006.01)
*H03H 9/25* (2006.01)

(52) U.S. Cl.
USPC ........................ 333/193; 333/195; 310/313 B

(58) Field of Classification Search .......... 333/193–196; 310/313 B
See application file for complete search history.

(56) References Cited

U.S. PATENT DOCUMENTS

| 2007/0018536 | A1 | 1/2007 | Kadota et al. |
| 2008/0074212 | A1* | 3/2008 | Matsuda et al. ............... 333/195 |
| 2008/0129418 | A1* | 6/2008 | Miura et al. ................... 333/195 |
| 2009/0108961 | A1 | 4/2009 | Roesler et al. |
| 2009/0189483 | A1* | 7/2009 | Kadota et al. ............. 310/313 B |
| 2011/0133600 | A1* | 6/2011 | Kimura et al. ............ 310/313 B |

FOREIGN PATENT DOCUMENTS

| JP | 2008-294538 | * | 12/2008 |
| WO | 2007/124732 A1 | | 11/2007 |
| WO | WO 2008/044411 | * | 4/2008 |
| WO | 2010/016192 A1 | | 2/2010 |

OTHER PUBLICATIONS

English language machine translation of JP 2008-294538, published Dec. 4, 2008.*
Official Communication issued in corresponding German Patent Application No. 10 2010 016 431.3, mailed on Aug. 22, 2012.

* cited by examiner

*Primary Examiner* — Barbara Summons
(74) *Attorney, Agent, or Firm* — Keating & Bennett, LLP

(57) ABSTRACT

A boundary acoustic wave device includes a piezoelectric substrate having an upper surface in which grooves are provided, IDT electrodes which are at least partially embedded in the grooves in the upper surface of the piezoelectric substrate in a thickness direction of the IDT electrodes, and first and second dielectric layers stacked on the upper surface of the piezoelectric substrate. The second dielectric layer has an acoustic velocity greater than that of the first dielectric layer.

10 Claims, 5 Drawing Sheets

BOUNDARY ACOUSTIC WAVE DEVICE HAVING AN INTERDIGITAL TRANSDUCER ELECTRODE IN A GROOVE

BACKGROUND OF THE INVENTION

1. Field of the Invention

The present invention relates to boundary acoustic wave devices used as resonators or filter devices, and more particularly to a boundary acoustic wave device having a three-medium structure in which a silicon oxide layer and a dielectric layer made of a dielectric having an acoustic velocity higher than that of silicon oxide are stacked on a piezoelectric substrate made of $LiTaO_3$.

2. Description of the Related Art

Boundary acoustic wave devices have recently been attracting attention instead of surface acoustic wave devices. Boundary acoustic wave devices do not require packages having cavities, and therefore, the size thereof can be reduced.

International Patent Publication No. WO2007/124732 discloses a boundary acoustic wave device 101 having a sectional structure shown in FIG. 5. The boundary acoustic wave device 101 includes a piezoelectric substrate 102 made of $LiTaO_3$ and first and second dielectric layers 103 and 104 stacked on the piezoelectric substrate 102 in that order. The second dielectric layer 104 has an acoustic velocity greater than that of the first dielectric layer 103. Interdigital transducer (IDT) electrodes 105 are provided on the upper surface of the piezoelectric substrate 102, and the first dielectric layer 103 is arranged so as to cover the IDT electrodes 105.

As described above, International Patent Publication No. WO2007/124732 discloses the boundary acoustic wave device 101 having a three-medium structure in which the first and second dielectric layers 103 and 104 are stacked on the piezoelectric substrate 102. Since the second dielectric layer 104 is provided, propagation loss in the boundary acoustic waves is reduced by the waveguide effect. In addition, in the piezoelectric substrate 102 made of $LiTaO_3$, characteristics, such as an electromechanical coupling coefficient, can be increased by setting Euler angles within predetermined ranges.

However, according to the structure described in International Patent Publication No. WO2007/124732, the electromechanical coupling coefficient cannot be sufficiently increased even when the Euler angles are set within predetermined ranges.

SUMMARY OF THE INVENTION

To overcome the problems described above, preferred embodiments of the present invention provide a boundary acoustic wave device that is capable of increasing the electromechanical coupling coefficient of the boundary acoustic waves and thereby increasing the band width.

A preferred embodiment of the present invention provides a boundary acoustic wave device including a piezoelectric substrate having an upper surface in which a groove is provided, a first dielectric layer stacked on the piezoelectric substrate, a second dielectric layer stacked on the first dielectric layer, and an IDT electrode disposed at a boundary between the piezoelectric substrate and the first dielectric layer, at least a portion of the IDT electrode being embedded in the groove provided in the upper surface of the piezoelectric substrate in a thickness direction of the IDT electrode.

In the boundary acoustic wave device according to this preferred embodiment of the present invention, the portion of the IDT electrode is embedded in the groove provided in the upper surface of the piezoelectric substrate in the thickness direction of the IDT electrode, and a remaining portion of the IDT electrode projects upward from the upper surface of the piezoelectric substrate. Thus, according to this preferred embodiment of the present invention, a portion of the IDT electrode may preferably be embedded in the groove in the thickness direction of the IDT electrode. Alternatively, the IDT electrode may be entirely embedded in the groove in the thickness direction thereof. In such a case, the upper surface of the IDT electrode is flush or substantially flush with the upper surface of the piezoelectric substrate, and the upper surfaces of the first and second dielectric layers can be flattened.

In the boundary acoustic wave device according to another preferred embodiment of the present invention, the piezoelectric substrate is preferably composed of $LiTaO_3$ or $LiNbO_3$, for example. By using $LiTaO_3$ or $LiNbO_3$, the electromechanical coupling coefficient can be increased. Therefore, the band width can be increased.

In the boundary acoustic wave device according to another preferred embodiment of the present invention, the first dielectric layer is preferably composed of silicon oxide, for example. Since silicon oxide has a positive temperature coefficient of resonant frequency (TCF), when the first dielectric layer made of silicon oxide is used together with a piezoelectric substrate made of a piezoelectric material, such as $LiTaO_3$, for example, which has a negative temperature coefficient of resonant frequency (TCF), the absolute value of the temperature coefficient of resonant frequency (TCF) of the boundary acoustic wave device can be reduced.

In the boundary acoustic wave device according to another preferred embodiment of the present invention, the second dielectric layer is preferably composed of at least one kind of dielectric material selected from the group consisting of silicon nitride, silicon oxynitride, aluminum nitride, aluminum oxide, and silicon, for example. These dielectric materials have an acoustic velocity greater than that of silicon oxide, and therefore, the boundary acoustic waves can be enclosed in an area inside from the second dielectric layer. As a result, propagation loss can be reduced by the waveguide effect.

In the boundary acoustic wave device according to another preferred embodiment of the present invention, the IDT electrode preferably includes a main electrode layer composed of a metal material with a density of about 16 $g/cm^3$ or more, for example. When the main electrode layer is made of a metal material with a high density as described above, the power durability of the IDT electrode can be increased. Although the metal material is not particularly limited, the metal material is preferably at least one kind of metal selected from the group consisting of Pt, W, Ta, Au, and Ir or an alloy containing the selected metal as a main component, for example.

In the boundary acoustic wave device, the IDT electrode may preferably further include an auxiliary electrode layer composed of a metal or an alloy, the metal or the alloy having a density about 4 $g/cm^3$ to about 16 $g/cm^3$, for example. In such a case, by suitably selecting the metal material of the auxiliary electrode layer, the adhesion between the electrode layers and the adhesion of the electrode layers to the first dielectric layer and the piezoelectric substrate can be increased. In addition, interdiffusion of the electrode materials between the electrode layers at either side of the auxiliary electrode layer can be suppressed. A material of the auxiliary electrode layer may preferably be, for example, at least one kind of metal selected from the group consisting of Ti, $TiO_2$, TiN, Ni, and NiCr.

In addition, in the boundary acoustic wave device, the IDT electrode may preferably further include an electrode layer composed of Al or a material containing Al as a main component, for example. Since the electrode layer composed of Al or a material containing Al as a main component has a low electrical resistance, the electrical resistance of the IDT electrode can be reduced.

In the boundary acoustic wave device according to the preferred embodiments of the present invention, at least a portion of the IDT electrode in the thickness direction thereof is embedded in a groove provided in the upper surface of the piezoelectric substrate. Therefore, the electromechanical coupling coefficient can be increased. As a result, the band width of the boundary acoustic wave device can be increased.

Therefore, a pass band width can be increased in, for example, a boundary acoustic wave filter and a frequency difference between a resonant frequency and an anti-resonant frequency can be increased in, for example, a boundary acoustic wave resonator.

In addition, since a portion of the IDT electrode is embedded in the groove provided in the upper surface of the piezoelectric substrate, the amount of projection of the electrode is reduced. Accordingly, irregularities of the boundary between the first dielectric layer made of silicon oxide and the second dielectric layer can be reduced. As a result, scattering of the waves at the boundary can be suppressed and the characteristics of the boundary acoustic wave device can be improved. In addition, since irregularities of the boundary are relatively small, the silicon oxide layer, that is, the first dielectric layer, can be evenly scraped and frequency adjustment can be accurately performed using the silicon oxide layer.

Other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

Preferred embodiments of the present invention will now be described with reference to the drawings to clarify the present invention.

Figure 2:
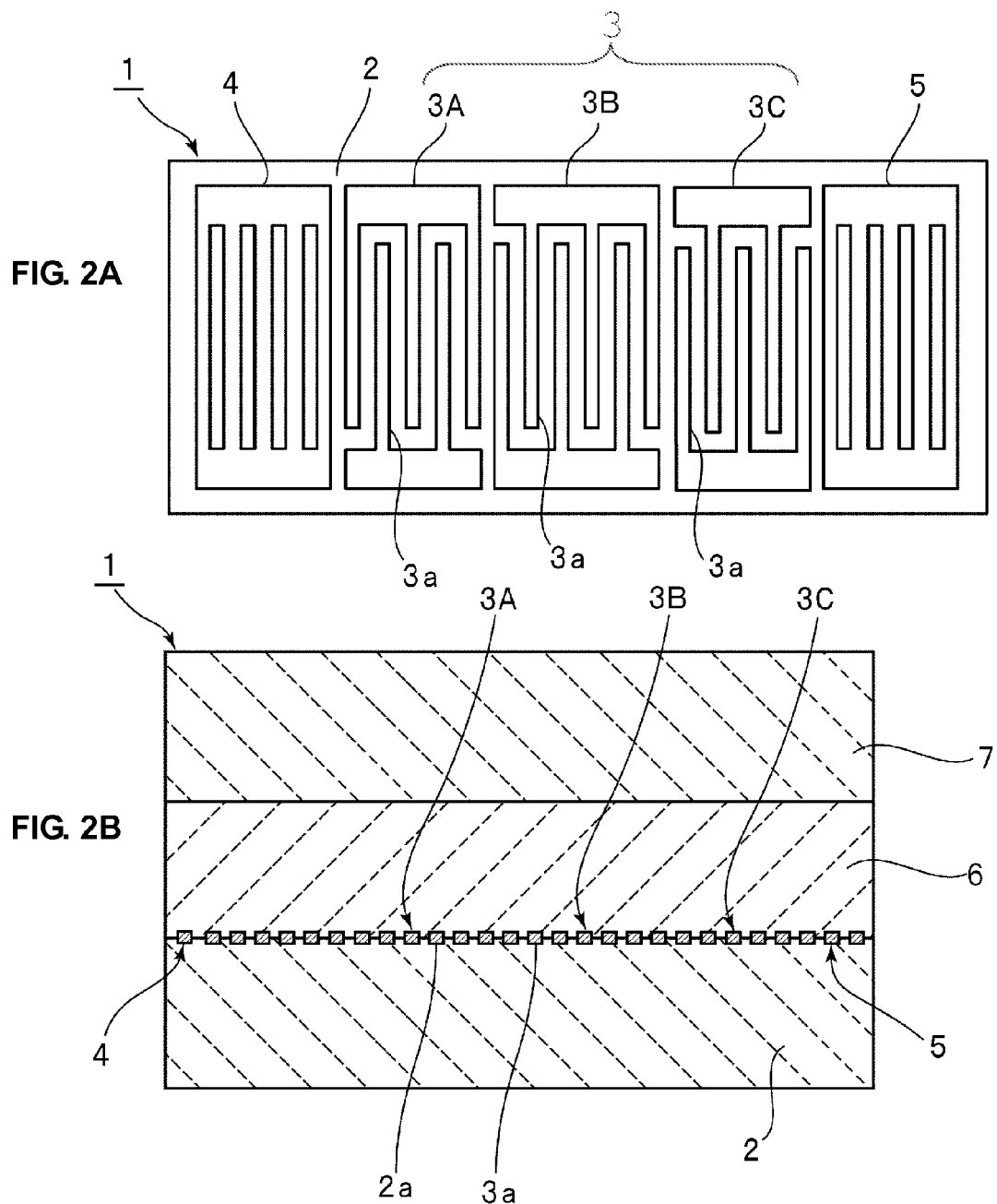
FIG. 2A is a schematic plan view illustrating the electrode structure of the boundary acoustic wave device according to the first preferred embodiment of the present invention.
FIG. 2B is a schematic sectional front view of a boundary acoustic wave device according to the first preferred embodiment of the present invention.

FIGS. 2A and 2B are a schematic plan view and a schematic sectional front view, respectively, of a boundary acoustic wave device according to a first preferred embodiment of the present invention.

As shown in FIG. 2B, a boundary acoustic wave device 1 includes a piezoelectric substrate 2 preferably made of $LiTaO_3$, for example. Alternatively, the piezoelectric substrate 2 may be made of other piezoelectric single crystals, such as $LiNbO_3$ and quartz crystal, or piezoelectric ceramics, such as PZT, for example. Grooves 2a are provided in the upper surface of the piezoelectric substrate 2.

IDT electrodes 3A to 3C are arranged such that the IDT electrodes 3A to 3C are at least partially embedded in the grooves 2a in the thickness direction of the IDT electrodes 3.

As shown in FIG. 2A, an electrode structure according to the present preferred embodiment includes the IDT electrodes 3A to 3C and reflectors 4 and 5. The reflectors 4 and 5 are disposed on either side of an area in which the IDT electrodes 3A to 3C are provided in a direction in which the boundary acoustic waves propagate. In other words, this electrode structure defines a three-IDT longitudinally coupled resonator-type boundary acoustic wave filter. Each of the IDT electrodes 3A to 3C includes a plurality of electrode fingers 3a. The reflectors 4 and 5 are preferably grating-type reflectors in which electrode fingers are short-circuited at the ends thereof.

A first dielectric layer 6 is arranged so as to cover the above-described electrode structure. A second dielectric layer 7 made of a dielectric material having an acoustic velocity greater than that of the first dielectric layer 6 is provided on the upper surface of the first dielectric layer 6.

According to the present preferred embodiment, the first dielectric layer 6 is preferably made of silicon oxide and the second dielectric layer 7 is preferably made of silicon nitride, for example.

Thus, the boundary acoustic wave device 1 has a three-medium structure in which the piezoelectric substrate 2, the first dielectric layer 6, and the second dielectric layer 7 are stacked in that order. In the boundary acoustic wave device having the three-medium structure, since the second dielectric layer 7 is provided, the boundary acoustic waves are enclosed in an area inside from the second dielectric layer 7. Therefore, propagation loss can be reduced by the waveguide effect.

Preferably, the first dielectric layer 6 is made of silicon oxide, for example, as in the present preferred embodiment. Silicon oxide has a positive temperature coefficient of resonant frequency (TCF). In contrast, piezoelectric materials, such as $LiTaO_3$ and $LiNbO_3$, have negative temperature coefficients of resonant frequency (TCF). Therefore, the absolute value of the temperature coefficient of resonant frequency (TCF) of the boundary acoustic wave device 1 can be reduced by using silicon oxide. As a result, variations in the frequency characteristics due to temperature variations can be advantageously reduced.

The IDT electrodes 3A to 3C and the electrode fingers included in the reflectors 4 and 5 are partially embedded in the grooves 2a. Since the electrode fingers are arranged such that the grooves 2a are filled with portions of the electrode materials, the electromechanical coupling coefficient $K^2$ can be increased in the IDT electrodes 3A to 3C. As a result, the band width ratio can be increased.

This will now be described more specifically.

Figure 1:
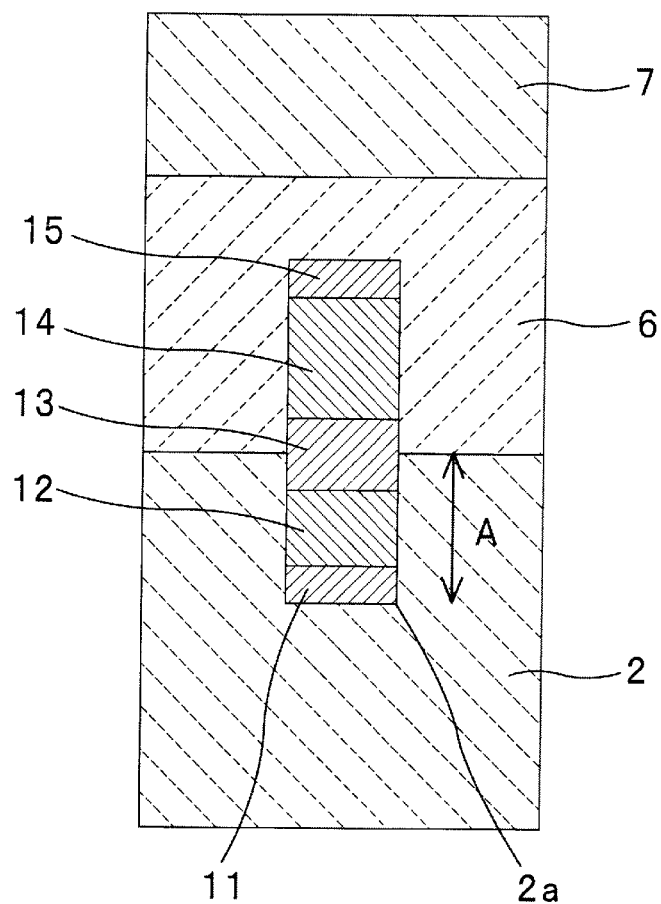
FIG. 1 is a partially enlarged sectional front view illustrating the electrode structure of a boundary acoustic wave device according to a first preferred embodiment of the present invention.

FIG. 1 is an enlarged view of a portion of the boundary acoustic wave device 1 according to the present preferred embodiment in which one of the electrode fingers included in the IDT electrodes 3 is disposed. As shown in FIGS. 1 and 2B, each IDT electrode 3 is partially embedded in the corresponding groove 2a. Here, A represents the depth of the groove 2a.

Each IDT electrode preferably has a layered structure in which a Ti film 11, a Pt film 12, a Ti film 13, an Al film 14, and a Ti film 15 are stacked in that order from the bottom, for example.

The density of Ti is about 4.54 g/cm$^3$, the density of Pt is about 21.45 g/cm$^3$, and the density of Al is about 2.7 g/cm$^3$.

In the present specification, the electrode layers included in each IDT electrode are classified as follows in accordance with the density of each electrode layer.

The electrode layers made of metal with a density of about 16 g/cm$^3$ or more are defined as main electrode layers. Therefore, the Pt film 12 is a main electrode layer. The electrode layers made of metal with a density equal to or greater than about 4 g/cm$^3$ and less than about 16 g/cm$^3$ are defined as auxiliary electrode layers. Therefore, the Ti films 11, 13, and 15 are auxiliary electrode layers.

The electrode layers with a density of less than about 4 g/cm$^3$ are defined as low-density electrode layers. Therefore, the Al film 14 is a low-density electrode layer.

The longitudinally coupled resonator-type boundary acoustic wave device 1 according to the above-described preferred embodiment was manufactured in accordance with the following specification, and the attenuation frequency characteristics of the manufactured device were measured.

The thickness of each layer of the boundary acoustic wave device 1 was set as follows:
Second dielectric layer 7 made of silicon nitride: about 2,200 nm
    First dielectric layer 6: about 760 nm
    Layered electrode structure (Ti/Al/Ti/Pt/Ti from the top): 10/150/10/76/10 (the units are nm for each layer)

Here, the Euler angle θ of the piezoelectric substrate 2 made of LiTaO$_3$ was set to about 132°. More specifically, the Euler angles were (0°, 132°, 0°). Therefore, the propagation angle Ψ was 0°. The depth of the grooves 2a was set to about 86 nm.

The duty ratio of each IDT electrode was set to about 0.50.

The intersecting width of the electrode fingers in each IDT electrode was set to about 80 μm, and the numbers of pairs of electrode fingers included in the IDT electrodes 3A to 3C were set to 8, 14, and 8, respectively. The number of pairs of electrode fingers included in each of the reflectors 4 and 5 was set to 15. In the IDT electrodes 3A to 3C, λ (wavelength of the boundary acoustic wave) was set to about 1.9 μm. Two electrode fingers in an area in which two IDT electrodes are disposed adjacent to each other are configured as narrow-pitch electrode fingers, and λ of the narrow-pitch electrode fingers was set to about 1.7 μm.

In addition, λ of the reflectors 4 and 5 was set to about 1.92 μm.

Figure 3:
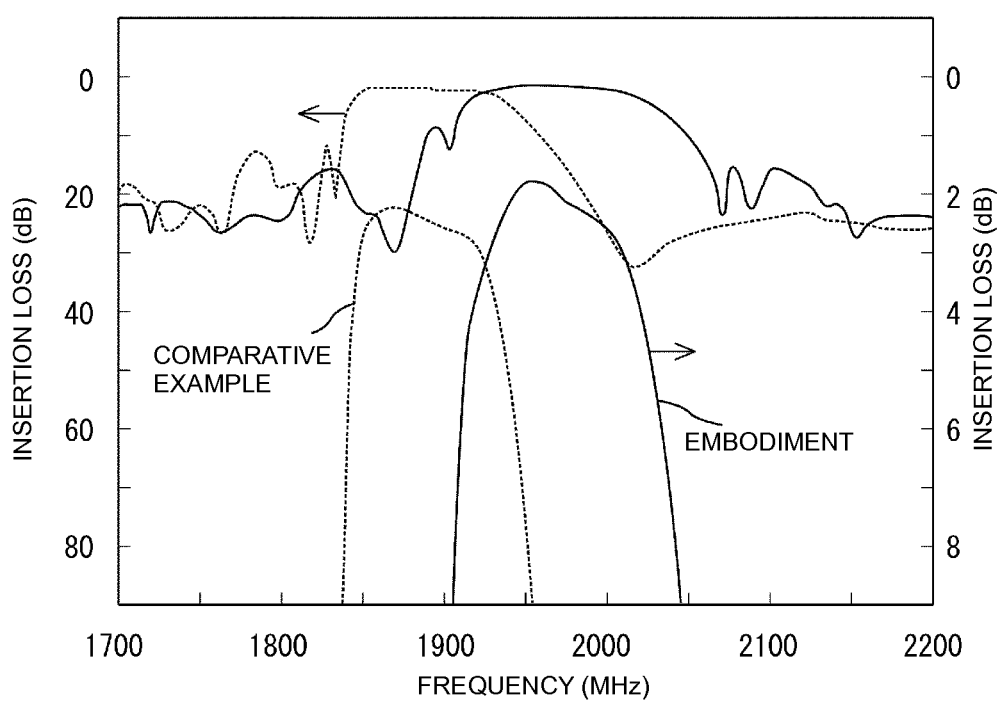
FIG. 3 is a graph illustrating the attenuation frequency characteristics of the boundary acoustic wave device according to a preferred embodiment of the present invention and a boundary acoustic wave device according to a comparative example.

The transmission characteristics of the boundary acoustic wave device are shown by the solid lines in FIG. 3. For comparison, a boundary acoustic wave device having the same structure as the above-described structure except that the embedding amount A was changed from 86 nm to 0 nm, that is, no grooves were provided, was manufactured as a comparative example. The transmission characteristics of the boundary acoustic wave device of the comparative example are shown by the broken lines in FIG. 3.

As shown in FIG. 3, according to the present preferred embodiment, as compared to the comparative example, the pass band width can be increased, propagation loss in the pass band width can be reduced, and the frequency of the pass band width can be increased. This is because the electromechanical coupling coefficient K$^2$ is increased since the IDT electrodes are partially embedded in the grooves 2a and the pass band width is increased accordingly. In addition, since the Euler angle θ is close to the optimum value, the acoustic velocity is increased. This presumably provides the effect that the frequency is increased in addition to the propagation loss being reduced.

Next, similar to the above-described preferred embodiment, a plurality of types of boundary acoustic wave devices were manufactured in which the amounts by which the IDT electrodes 3A to 3C and the electrode fingers in the reflectors 4 and 5 were embedded in the grooves 2a in the thickness direction thereof were set to about 0%, about 1%, about 2%, about 3%, about 4%, and about 5% of λ. The device in which the embedding amount was about 0% of λ corresponds to the above-described comparative example.

Figure 4:
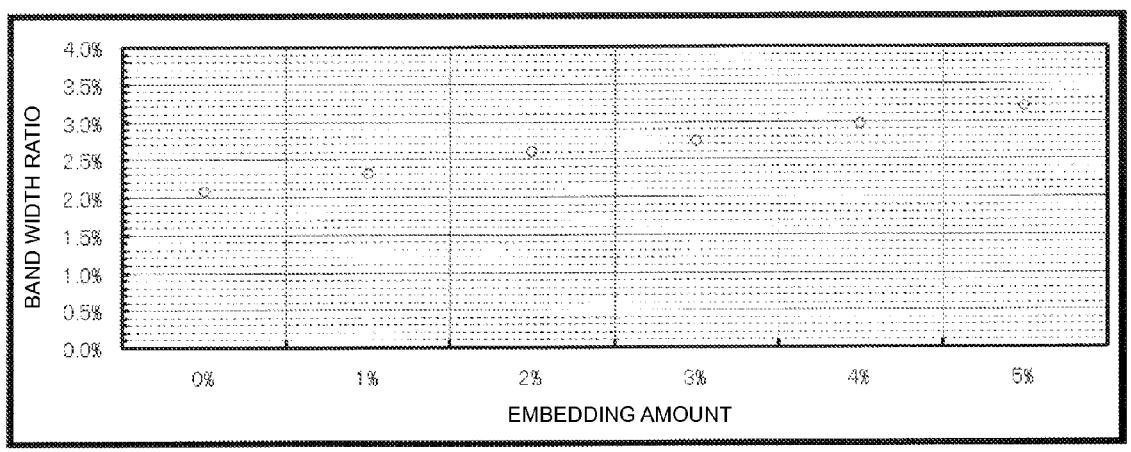
FIG. 4 is a graph illustrating variations in the band width ratio when the amount by which IDT electrodes are embedded in grooves is varied in the boundary acoustic wave device according to a preferred embodiment of the present invention.
Figure 5:
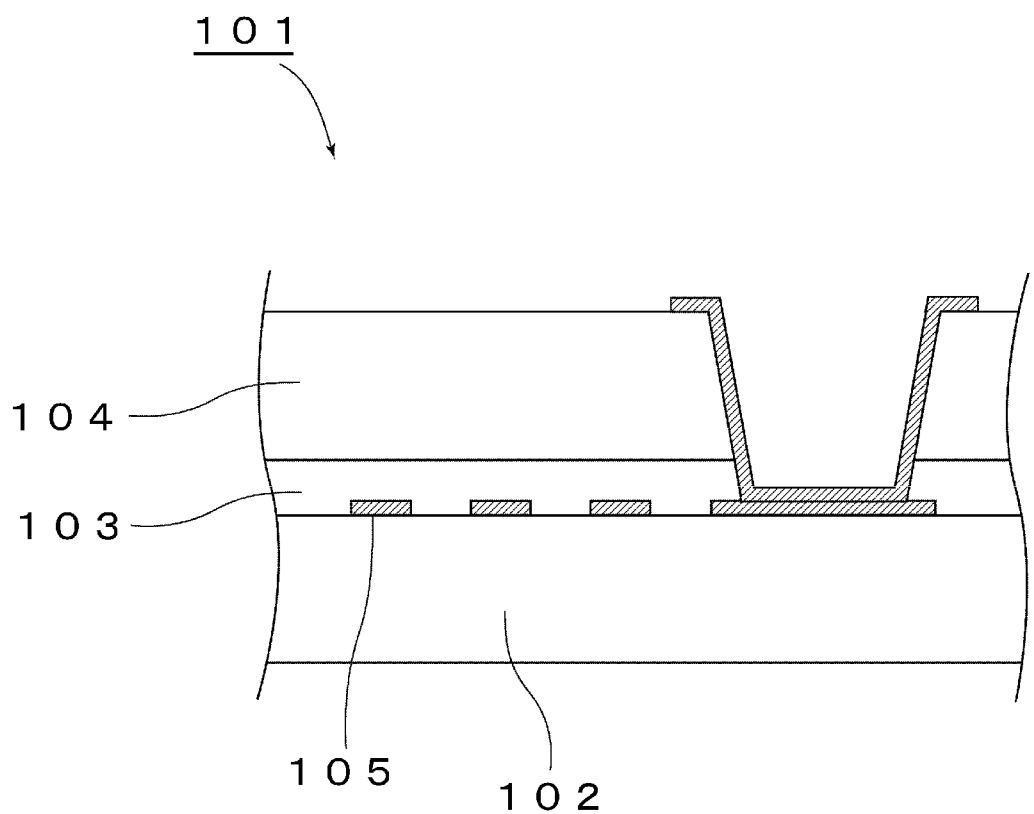
FIG. 5 is a schematic sectional view illustrating the electrode structure of a boundary acoustic wave device according to the related art.

The transmission characteristics of the plurality of types of boundary acoustic wave devices were measured and the relationship between the embedding amount and the band width ratio was observed. The results are shown in FIG. 4. As shown in FIG. 4, as the embedding amount increases, the band width ratio increases and the electromechanical coupling coefficient K$^2$ also increases accordingly.

Although the IDT electrodes 3A to 3C were partially embedded in the grooves 2a in the thickness direction thereof according to the above-described explanation, the IDT electrodes 3A to 3C may be entirely embedded in the grooves 2a in the thickness direction thereof so that the upper surfaces of the IDT electrodes 3A to 3C are flush or substantially with the upper surface of the piezoelectric substrate 2. In addition, although the longitudinally coupled resonator-type boundary acoustic wave device 1 is explained above, the present invention is not limited to the three-IDT longitudinally coupled resonator-type boundary acoustic wave filter device. It is to be noted that the present invention can also be applied to various other types of boundary acoustic wave devices.

In the above-described preferred embodiments of the present invention, the Ti films 13 and 15, which are auxiliary electrode layers, are preferably provided at the upper side of the Pt film 12, which is a main electrode layer. In addition, the Ti film 11, which is also an auxiliary electrode layer, is preferably provided at the lower side of the Pt film 12. However, the auxiliary electrode layers may be provided only at the upper side or the lower side of the Pt film 12.

As described above, the auxiliary electrode layers may be provided at the lower side of the main electrode layer in addition to the upper side thereof since the material, such as Ti, which defines the auxiliary electrode layers has a function of increasing the adhesion between the electrode layers and the adhesion of the electrode layers to the piezoelectric substrate and a function of suppressing diffusion of the electrode materials.

In addition, although a single Pt film 12 was provided as the main electrode layer in the above-described preferred embodiment, a plurality of main electrode layers may be provided.

The metal which defines the main electrode layer is not particularly limited as long as the density thereof is equal to or greater than about 16 g/cm$^3$. Preferably, at least one kind of metal selected from the group consisting of Pt, W, Ta, Au, and Ir or an alloy containing the selected metal as a main component, for example, is used. In such a case, the reliability can be increased.

The metal which defines each auxiliary electrode layer is not particularly limited as long as the density thereof is in the range of about 4 g/cm$^3$ to about 16 g/cm$^3$. Preferably, the auxiliary electrode layers are made of at least one kind of metal selected from the group consisting of Ti, TiO$_2$, TiN, Ni, and NiCr, for example. In such a case, the adhesion of the auxiliary electrode layers to the other electrode layers and the piezoelectric substrate can be increased and diffusion of the electrode materials between the electrode layers can be suppressed.

In addition, in the above-described preferred embodiments, the Al film 14, which is a low-density electrode layer, is provided. However, the low-density electrode layer may be omitted.

In addition, although Al is preferably used as the material of the low-density electrode layer, the low-density electrode layer may instead be formed of any metal having a density of less than about 4 g/cm$^3$. Preferably, the low-density electrode layer is made of Al or an alloy containing Al as a main component, for example. In such a case, the resistance loss of the IDT electrodes can be reduced since the electrical resistance of the low-density electrode layer is relatively low.

In the above-described preferred embodiments, the IDT electrodes 3A to 3C preferably have a layered structure in which the main electrode layer, the auxiliary electrode layers, and the low-density electrode layer are stacked. However, the structure of the IDT electrodes 3A to 3C is not limited to the layered structure in which a plurality of electrode layers are stacked. The IDT electrodes 3A to 3C may include a single metal layer or alloy layer, for example.

Although the first dielectric layer 6 is preferably made of silicon oxide in the above-described preferred embodiments, the first dielectric layer 6 may be made of other dielectric materials, such as silicon nitride, silicon oxynitride, aluminum nitride, aluminum oxide, and silicon, for example.

The second dielectric layer 7 may be made of any dielectric material as long as the second dielectric layer 7 has an acoustic velocity greater than that of the first dielectric layer 6. Preferably, the dielectric material is silicon nitride, silicon oxynitride, aluminum nitride, aluminum oxide, or silicon, for example. In any case, since the acoustic velocity of the second dielectric layer is relatively high, the energy of the boundary waves can be enclosed in an area inside from the second dielectric layer 7. As a result, the transmission characteristics can be improved. In addition, since silicon nitride, silicon oxynitride, aluminum nitride, aluminum oxide, and silicon are conventionally used dielectric materials, the second dielectric layer 7 can be made at a relatively low cost.

While preferred embodiments of the present invention have been described above, it is to be understood that variations and modifications will be apparent to those skilled in the art without departing from the scope and spirit of the present invention. The scope of the invention, therefore, is to be determined solely by the following claims.

What is claimed is:

1. A boundary acoustic wave device, comprising:
   a piezoelectric substrate including an upper surface in which a groove is provided;
   a first dielectric layer stacked on the piezoelectric substrate;
   a second dielectric layer stacked on the first dielectric layer; and
   an interdigital transducer electrode disposed at a boundary between the piezoelectric substrate and the first dielectric layer, at least a portion of the interdigital transducer electrode being embedded in the groove provided in the upper surface of the piezoelectric substrate in a thickness direction of the interdigital transducer electrode.

2. The boundary acoustic wave device according to claim 1, wherein the portion of the interdigital transducer electrode is embedded in the groove provided in the upper surface of the piezoelectric substrate in the thickness direction of the interdigital transducer electrode, and a remaining portion of the interdigital transducer electrode projects upward from the upper surface of the piezoelectric substrate.

3. The boundary acoustic wave device according to claim 1, wherein the piezoelectric substrate is made of LiTaO$_3$ or LiNbO$_3$.

4. The boundary acoustic wave device according to claim 1, wherein the first dielectric layer is made of silicon oxide.

5. The boundary acoustic wave device according to claim 1, wherein the second dielectric layer is made of at least one dielectric material selected from the group consisting of silicon nitride, silicon oxynitride, aluminum nitride, aluminum oxide, and silicon.

6. The boundary acoustic wave device according to claim 1, wherein the interdigital transducer electrode includes a main electrode layer made of a metal material with a density of at least about 16 g/cm$^3$.

7. The boundary acoustic wave device according to claim 6, wherein the main electrode layer included in the interdigital transducer electrode is made of at least one kind of metal selected from the group consisting of Pt, W, Ta, Au, and Ir or an alloy containing the selected metal as a main component.

8. The boundary acoustic wave device according to claim 6, wherein the interdigital transducer electrode further includes an auxiliary electrode layer made of a metal or an alloy, the metal or the alloy having a density in a range of about 4 g/cm$^3$ to about 16 g/cm$^3$.

9. The boundary acoustic wave device according to claim 8, wherein the auxiliary electrode layer is composed of at least one kind of metal selected from the group consisting of Ti, TiO$_2$, TiN, Ni, and NiCr.

10. The boundary acoustic wave device according to claim 1, wherein the interdigital transducer electrode further includes an electrode layer composed of Al or a material containing Al as a main component.

* * * * *